(12) United States Patent
Ide et al.

(10) Patent No.: US 7,566,675 B2
(45) Date of Patent: Jul. 28, 2009

(54) CORROSION-RESISTANT MATERIAL MANUFACTURING METHOD

(75) Inventors: Takayuki Ide, Fukuoka (JP); Masakatsu Kiyohara, Fukuoka (JP)

(73) Assignee: Toto Ltd., Fukuoka (JP)

(*) Notice: Subject to any disclaimer, the term of this patent is extended or adjusted under 35 U.S.C. 154(b) by 0 days.

(21) Appl. No.: 12/214,994

(22) Filed: Jun. 24, 2008

(65) Prior Publication Data

US 2008/0274872 A1 Nov. 6, 2008

Related U.S. Application Data

(62) Division of application No. 11/486,956, filed on Jul. 14, 2006, now Pat. No. 7,407,904.

(30) Foreign Application Priority Data

Jul. 15, 2005 (JP) ............... 2005-206830
Jul. 13, 2006 (JP) ............... 2006-192408

(51) Int. Cl.
C04B 35/505 (2006.01)
C04B 35/64 (2006.01)

(52) U.S. Cl. .................................. 501/152

(58) Field of Classification Search .......... 501/152
See application file for complete search history.

(56) References Cited

U.S. PATENT DOCUMENTS 7,435,698 B2 * 10/2008 Ide et al. ............... 501/152

2006/0128547 A1 6/2006 Takada et al.

FOREIGN PATENT DOCUMENTS

| JP | 04-55368 | 2/1992 |
|---|---|---|
| JP | 04-059658 | 2/1992 |
| JP | 04-074764 | 3/1992 |
| JP | 04-238864 | 8/1992 |
| JP | 05-170534 | 7/1993 |
| JP | 10-273364 | 10/1998 |
| JP | 2000-239065 | 9/2000 |
| JP | 2001-031466 | 2/2001 |
| JP | 2001-181042 A | 7/2001 |
| JP | 2002-255647 A | 9/2002 |
| JP | 2003-048792 | 2/2003 |
| JP | 2003-055050 | 2/2003 |

OTHER PUBLICATIONS

Yanagita et al., Preparation of Transparent Yttrium Oxide Ceramics by HIP Sintering; "Annual Meeting of The Ceramic Society of Japan, 2004"; Mar. 22, 2004., p. 234; Published in Japan.

* cited by examiner

*Primary Examiner*—Karl E Group
(74) *Attorney, Agent, or Firm*—Carrier, Blackman & Associates, P.C.; Joseph P. Carrier; William D. Blackman

(57) ABSTRACT

The present invention provides a method of manufacturing an yttria ($Y_2O_3$) sintered body having high density and excellent plasma-resistance. The yttria sintered body has a structure in which a $Y_2O_3$ crystal and a $Y_3BO_6$ crystal are included as the constituent crystal thereof. In production of the yttria sintered body, a boron oxide ($B_2O_3$) of 0.02 wt % to 10 wt % is added to an yttria ($Y_2O_3$) powder, the mixed powder is formed, and thereafter sintered at 1300-1600° C.

3 Claims, 14 Drawing Sheets

FIG. 3
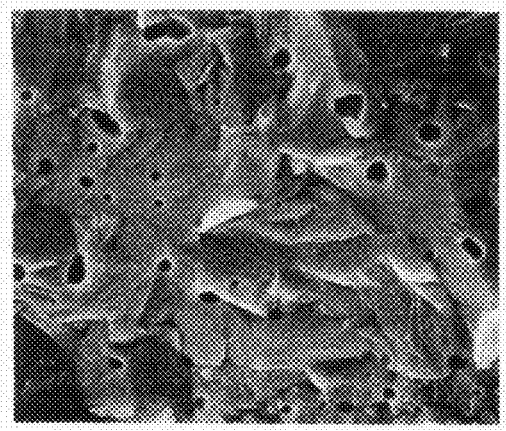
a) 0.1 wt% addition, firing at 1200°C
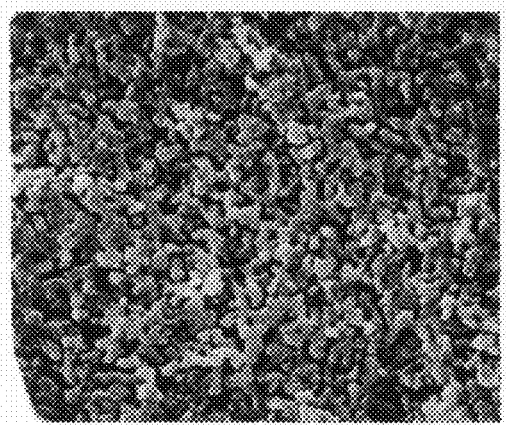
b) 0.1 wt% addition, firing at 1400°C
6 μm

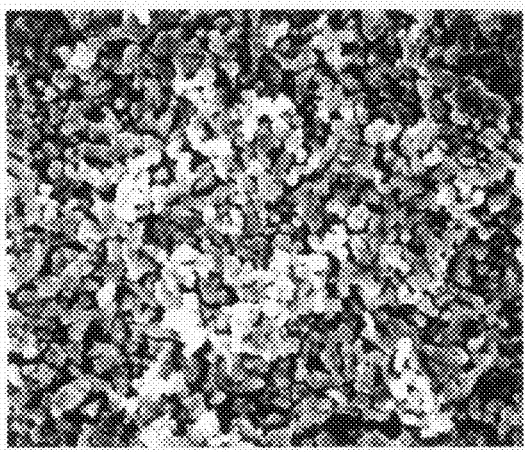
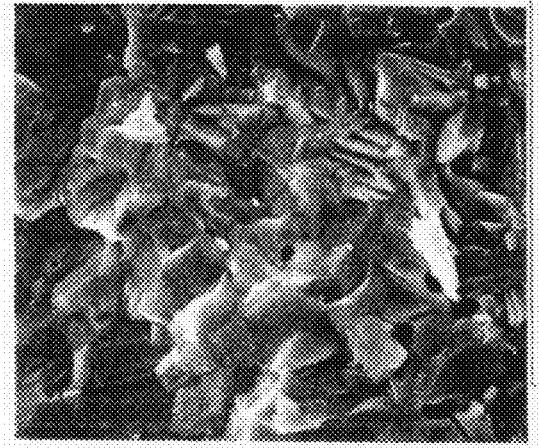
FIG. 5

US 7,566,675 B2

CORROSION-RESISTANT MATERIAL MANUFACTURING METHOD

CROSS REFERENCES TO RELATED APPLICATIONS

The present application is a divisional of prior U.S. patent application Ser. No. 11/486,956, filed 14 Jul. 2006, now U.S. Pat. No. 7,407,904, which claims priority under 35 USC 119 based on Japanese patent application Nos. 2005-206830, filed 15 Jul. 2005 and 2006-192408 filed 13 Jul. 2006. The subject matter of each of these priority documents is incorporated by reference herein.

BACKGROUND OF THE INVENTION

1. Field of the Invention

The present invention relates to a method of manufacturing an yttria sintered body which has low sintering temperature and excellent plasma-resistance.

2. Description of Prior Art

It is known that an yttria ($Y_2O_3$) has excellent plasma-resistance. Also, Patent Document 1-9 and Non-patent Document 1 have proposed that the density and the plasma-resistance of an yttria sintered body ($Y_2O_3$) are improved.

Patent Document 1 has proposed that a yttria ($Y_2O_3$) powder is formed by a cold isostatic press (CIP), the formed body is fired at 1400-1800° C., cooled, and thereafter heated at 1400-2000° C. in the presence of a boron compound ($B_2O_3$), so that a dense yttria ($Y_2O_3$) sintered body can be obtained. According to Patent Document 1, it is assumed that the dense sintered body can be obtained because the presence of a boron compound promotes sintering due to diffusion of a $B_2O_3$ inside the body.

Patent Document 2 has proposed that Si of 400 ppm or less and Al of 200 ppm or less are contained in an yttria to obtain an yttria sintered body having excellent plasma-resistance.

Patent Document 3 has proposed that Zr, Si, Ce or Al is used as a sintering aid to obtain an yttria sintered body having excellent plasma-resistance whose relative density is 95% or more, which cannot be achieved by a conventional technique.

Patent Documents 4-6 have disclosed that an yttria ($Y_2O_3$) sintered body having an excellent transparency and a mechanical strength can be obtained by a HIP treatment after hot pressing of an yttria ($Y_2O_3$) powder. Specifically, according to Patent Document 4, a lithium fluoride or a potassium fluoride is added as a sintering aid. According to Patent Document 5, a lanthanoid oxide is added as a sintering aid. According to Patent Document 6, the specific surface area (BET value) of an yttria ($Y_2O_3$) powder is adjusted to be $2\ m^2/g$ -$10\ m^2/g$.

Patent Document 7 has disclosed that Si of 200 ppm or less and Al of 100 ppm or less are contained in an yttria, and that Na, K, Ti, Cr, Fe, and Ni are adjusted to be 200 ppm or less, respectively, which is similar to Patent Document 2.

Patent Document 8 has disclosed that an yttria ($Y_2O_3$) green body or an yttria aluminum garnet green body having an excellent plasma-resistance is fired at 1650-2000° C. in a reducing atmosphere.

Patent Document 9 has proposed that a corrosion-resistant ceramic material used for an area to be exposed to plasma comprises an yttrium oxide, an aluminum oxide and a silicon oxide.

Non-patent Document 1 has disclosed that an yttria ($Y_2O_3$) powder is formed by a CIP (140 MPa), first sintering is performed to the formed body at 1400-1700° C., BN is sprayed on the sintered body, and second sintering is performed by a HIP (140 MPa, 1400-1700° C.), so that an yttria ($Y_2O_3$) sintered body having excellent transparency can be obtained.

Patent Document 1: Japanese Patent Application Publication No. 2000-239065
Patent Document 2: Japanese Patent Application Publication No. 2003-55050
Patent Document 3: Japanese Patent Application Publication No. 2001-181042
Patent Document 4: Japanese Patent Application Publication No. H04-59658
Patent Document 5: Japanese Patent Application Publication No. H04-238864
Patent Document 6: Japanese Patent Application Publication No. H04-74764
Patent Document 7: Japanese Patent Application Publication No. 2002-255647
Patent Document 8: Japanese Patent Application Publication No. 2003-48792
Patent Document 9: Japanese Patent Application Publication No. 2001-31466
Non-patent Document 1: Production of Transparent Yttrium Oxide by HIP sintering, The Ceramic Society of Japan, 2004, Preprint 2G09

Among these Documents, Patent Document 1 and Non-patent Document 1 disclose the closest technique to the present invention. Hereinafter, the details of Patent Document 1 and Non-patent Document 1 will be described.

Patent Document 1 discloses that heat treatment (HIP) is performed at 1400-2000° C. in the presence of a boron compound such as $B_2O_3$. Non-patent Document 1 discloses that a BN is sprayed, and second sintering is performed by a HIP at 1400-1700° C., so as to obtain an yttria ($Y_2O_3$) sintered body having a excellent transparency. Patent Document 1 also describes that even if the boron compound is not a $B_2O_3$, it is oxidized to be $B_2O_3$ by heating in an oxygen atmosphere or by bonding to an oxygen which is present on the surface of the fired body even in a case of heating in a no-oxygen atmosphere.

However, according to these documents, firing at relatively high temperature is required to obtain a sintered body having a small porosity, or a complicated manufacturing process such as a heat treatment in the presence of a boron compound after first sintering or a HIP treatment is required in order to obtain an yttria sintered body.

An object of the present invention is to provide an yttria ($Y_2O_3$) sintered body and a corrosion-resistance material having a high density and an excellent plasma-resistance which can be manufactured easily at low temperature, and a manufacturing method thereof.

SUMMARY OF THE INVENTION

The present inventors have been aware that the additional amount of $B_2O_3$ is very important to produce an yttria ($Y_2O_3$) sintered body by their researches. The results of the experiments the present inventors made show that when the additional amount of a $B_2O_3$ is large, a $YBO_3$ phase appears, and when the additional amount of a $B_2O_3$ is small, a $Y_3BO_6$ phase appears. If a $YBO_3$ phase is included in a sintered body, the effect of increasing the density can be achieved at lower temperature than a case of $Y_2O_3$ alone, however, a sintered body having a high density cannot be obtained. On the other hand, if a $Y_3BO_6$ phase is included, the density can be increased sufficiently.

Therefore, an yttria sintered body according to the present invention is obtained by adding a boron compound to an yttria ($Y_2O_3$) powder and firing, and characterized in that a boron (B) is present in the yttria sintered body substantially as a $Y_3BO_6$. The preferred amount of the $Y_3BO_6$ in the yttria sintered body is 0.12 vol % to 60 vol %.

In order to produce the above-described an yttria sintered body, a boron oxide ($B_2O_3$) powder of 0.02 wt % to 10 wt % is added to an yttria ($Y_2O_3$) powder, the mixed powder is formed, and thereafter sintered at 1300-1600° C., preferably at 1400-1500° C.

A corrosion-resistant material according to the present invention is used for a substrate processing apparatus, and characterized in that a $Y_2O_3$ crystal and a $Y_3BO_6$ crystal are included in the corrosion-resistant material as the constituent crystal thereof.

BRIEF DESCRIPTION OF THE DRAWINGS

FIG. 3(a) is a SEM photograph in a case of 0.1 wt % additions and firing at 1200° C., and FIG. 3(b) is a SEM photograph in a case of 0.1 wt % addition and firing at 1400° C.;

FIG. 5(a) is a SEM photograph in a case of 3 wt % additions and firing at 1200° C., and FIG. 5(b) is a SEM photograph in a case of 3 wt % addition and firing at 1400° C.;

DETAILED DESCRIPTION OF PREFERRED EMBODIMENTS

An yttria ($Y_2O_3$) powder (RU: manufactured by Shin-Etsu Chemical Co., Ltd.) and a boron oxide ($B_2O_3$) powder (reagent-grade: manufactured by Junsei Chemical Co., Ltd.) were prepared as raw powders. 8 kinds of samples were prepared by adding no boron oxide ($B_2O_3$) powder to the yttria ($Y_2O_3$) powder, and adding the boron oxide ($B_2O_3$) powder to the yttria ($Y_2O_3$) powder at a ratio of 0.02 wt %, 0.1 wt %, 1 wt %, 3 wt %, 10 wt %, 16 wt %, and 23.6 wt %, respectively, and thereafter firing was performed at a firing furnace.

Figure 1:
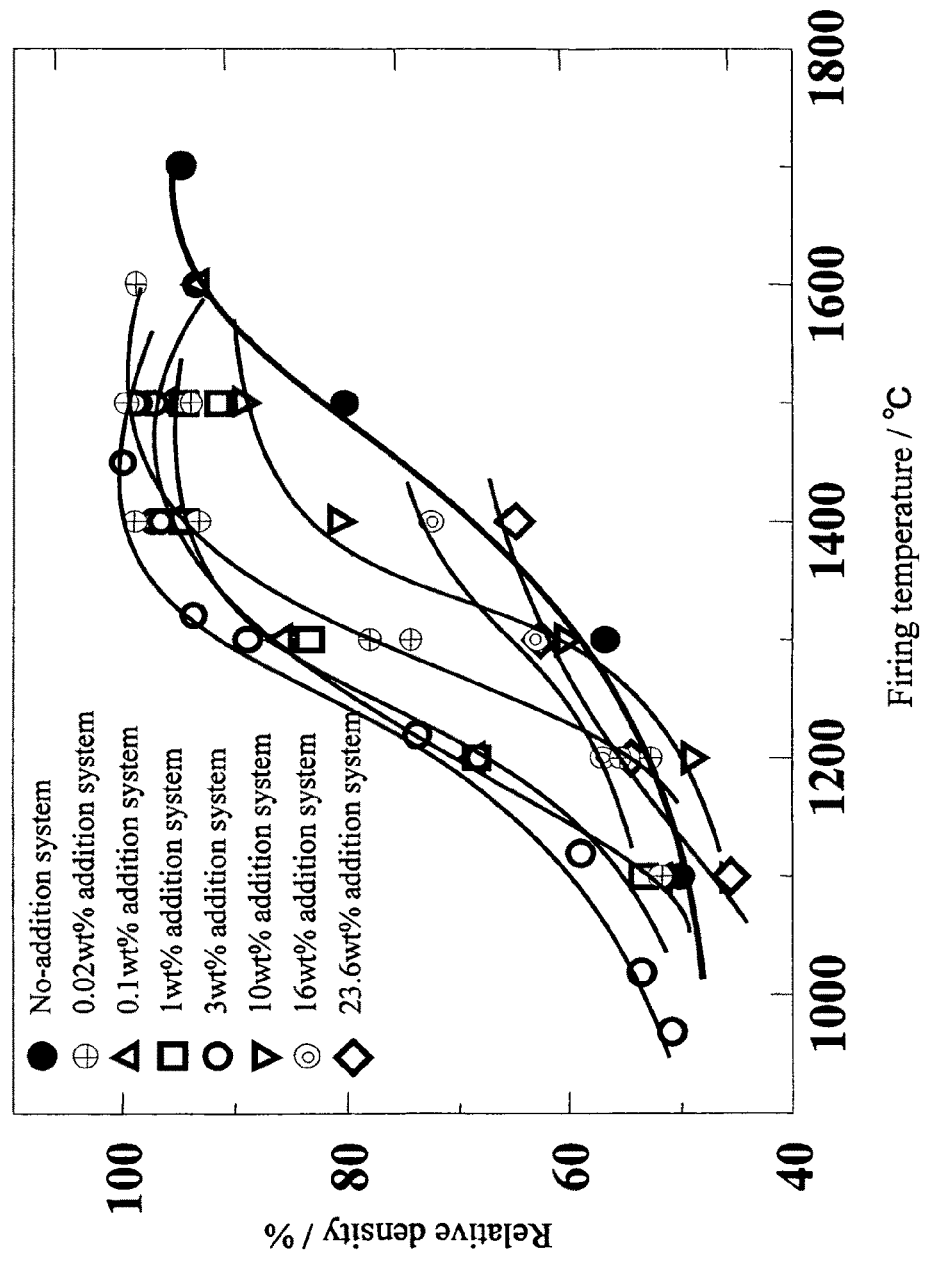
FIG. 1 shows the relationship between firing temperature and relative density corresponding to an additional amount of a $B_2O_3$.

FIG. 1 shows the relationship between the firing temperature and the obtained relative density. FIG. 1 demonstrates the following:

In the case of adding no boron oxide ($B_2O_3$) powder, the temperature reached 1700° C., and a sintered body having relative density of about 95% was obtained. These firing temperature and relative density correspond to a known value.

Almost the same results were confirmed with respect to the cases of adding the boron oxide ($B_2O_3$) at a ratio of 0.1 wt %, 1 wt %, and 3 wt %. Specifically, the relative density started increasing at about 1000° C., and the relative density of more than 95% was obtained at 1400-1500° C. In particular, the relative density was almost 100% in the case of adding the boron oxide ($B_2O_3$) at a ratio of 3 wt %. It is assumed that sintered bodies having higher density were obtained in these cases than in the case of adding no boron oxide ($B_2O_3$) because a $Y_3BO_6$ produces a liquid phase in the firing process so as to cause a liquid-phase sintering.

Also, in the cases of adding the boron oxide ($B_2O_3$) at a ratio of 0.1 wt %, 1 wt %, and 3 wt %, the sintered bodies disintegrated at around 1583° C. It is assumed that disintegration occurs at this temperature because the boiling point of a $Y_3BO_6$ is around this temperature.

In the case of 10 wt %, it was confirmed that the relative density became high at 1300-1500° C. It is assumed that the density became high because slightly included a $YBO_3$ disappeared due to evaporation or decomposition as the temperature increased so as to turn a Y-B compound into a single phase of a $Y_3BO_6$.

In this way, a sintered body having high density can be obtained at relatively low temperature (1300° C. or more and less than 1600° C.).

In the cases of 16 wt % and 23.6 wt %, the relative density hardly increased, and the sintered body disintegrated at about 1500° C. It is assumed that a boron (B) became a $YBO_3$ phase and the $YBO_3$ phase underwent evaporation or decomposition.

Figure 2:
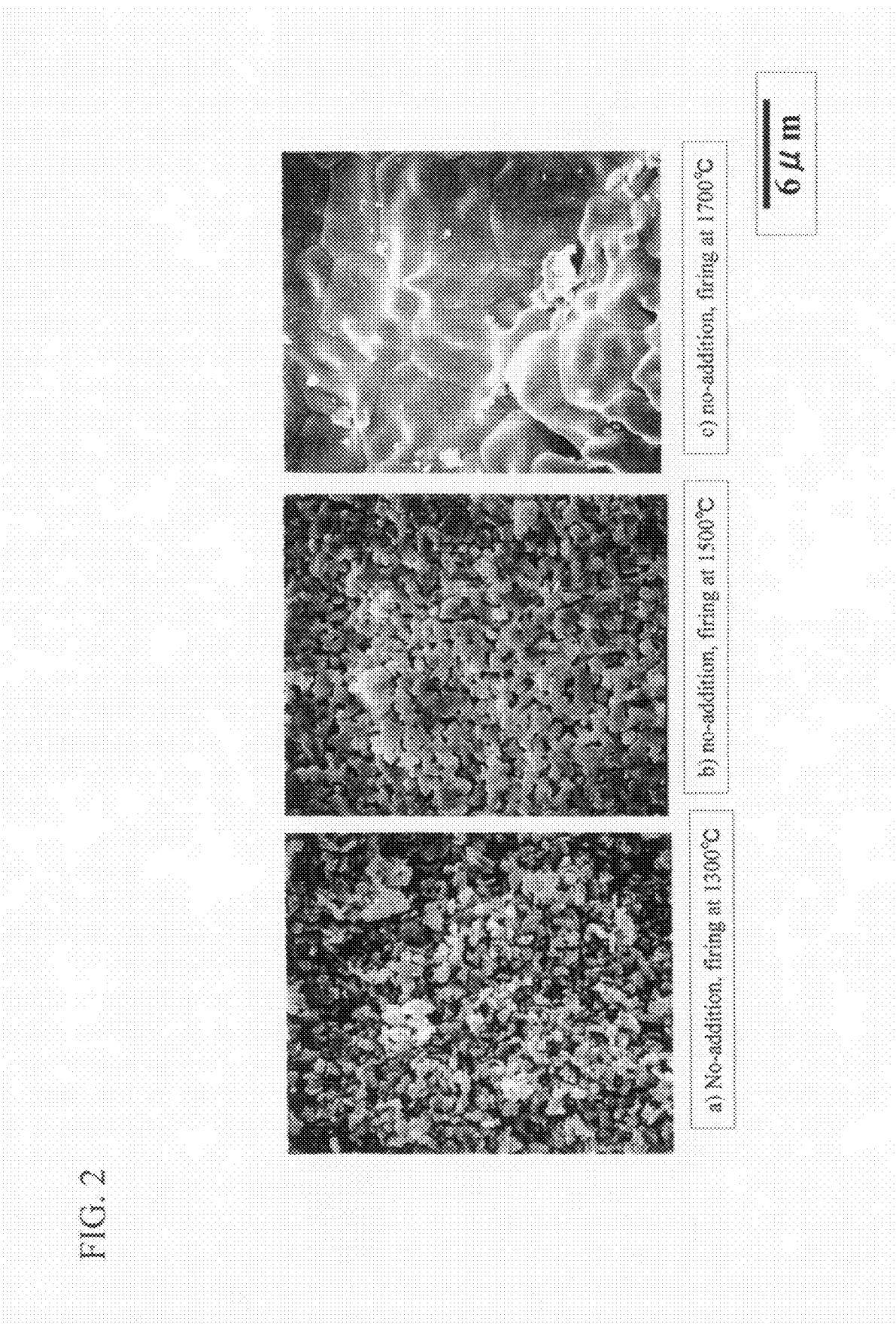
FIG. 2(a) is a SEM photograph in a case of no-addition and firing at 1300° C.
FIG. 2(b) is a SEM photograph in a case of no-addition and firing at 1500° C.
FIG. 2(c) is a SEM photograph in a case of no-addition and firing at 1700° C.

FIG. 2(a) is a SEM photograph in the case of no-addition and firing at 1300° C., FIG. 2(b) is a SEM photograph in the case of no-addition and firing at 1500° C., and FIG. 2(c) is a SEM photograph in the case of no-addition and firing at 1700° C. In the case of no-addition, densification did not occurred at 1500° C., and a solid-phase sintering occurred at 1700° C.

FIG. 3(a) is a SEM photograph in the case of 0.1 wt % addition and firing at 1200° C., and FIG. 3(b) is a SEM photograph in the case of 0.1 wt % addition and firing at 1400° C. Densification occurred at 1400° C. in this case.

Figure 4:
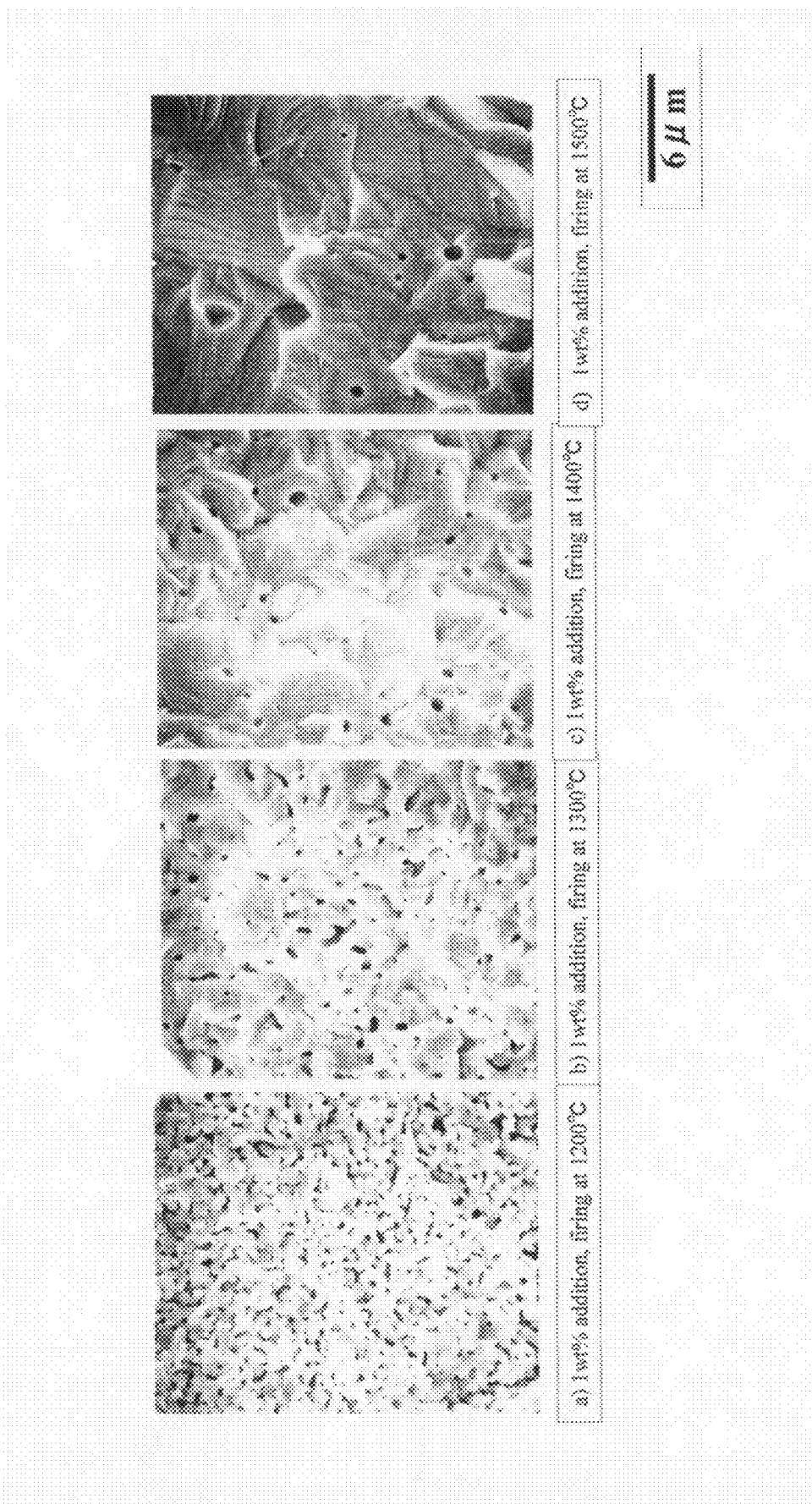
FIG. 4(a) is a SEM photograph in a case of 1 wt % addition and firing at 1200° C.
FIG. 4(b) is a SEM photograph in a case of 1 wt % addition and firing at 1300° C.
FIG. 4(c) is a SEM photograph in a case of 1 wt % addition and firing at 1400° C.
FIG. 4(d) is a SEM photograph in a case of 1 wt % addition and firing at 1500° C.

FIG. 4(a) is a SEM photograph in the case of 1 wt % addition and firing at 1200° C., FIG. 4(b) is a SEM photograph in the case of 1 wt % addition and firing at 1300° C., FIG. 4(c) is a SEM photograph in the case of 1 wt % addition and firing at 1400° C., and FIG. 4(d) is a SEM photograph in the case of 1 wt % addition and firing at 1500° C. The structure drastically changed at 1400° C. in this case.

FIG. 5(a) is a SEM photograph in the case of 3 wt % addition and firing at 1200° C., and FIG. 5(b) is a SEM photograph in the case of 3 wt % addition and firing at 1400° C. Densification occurred at 1400° C. in this case as well as in the case of 0.1 wt % addition.

Figure 6:
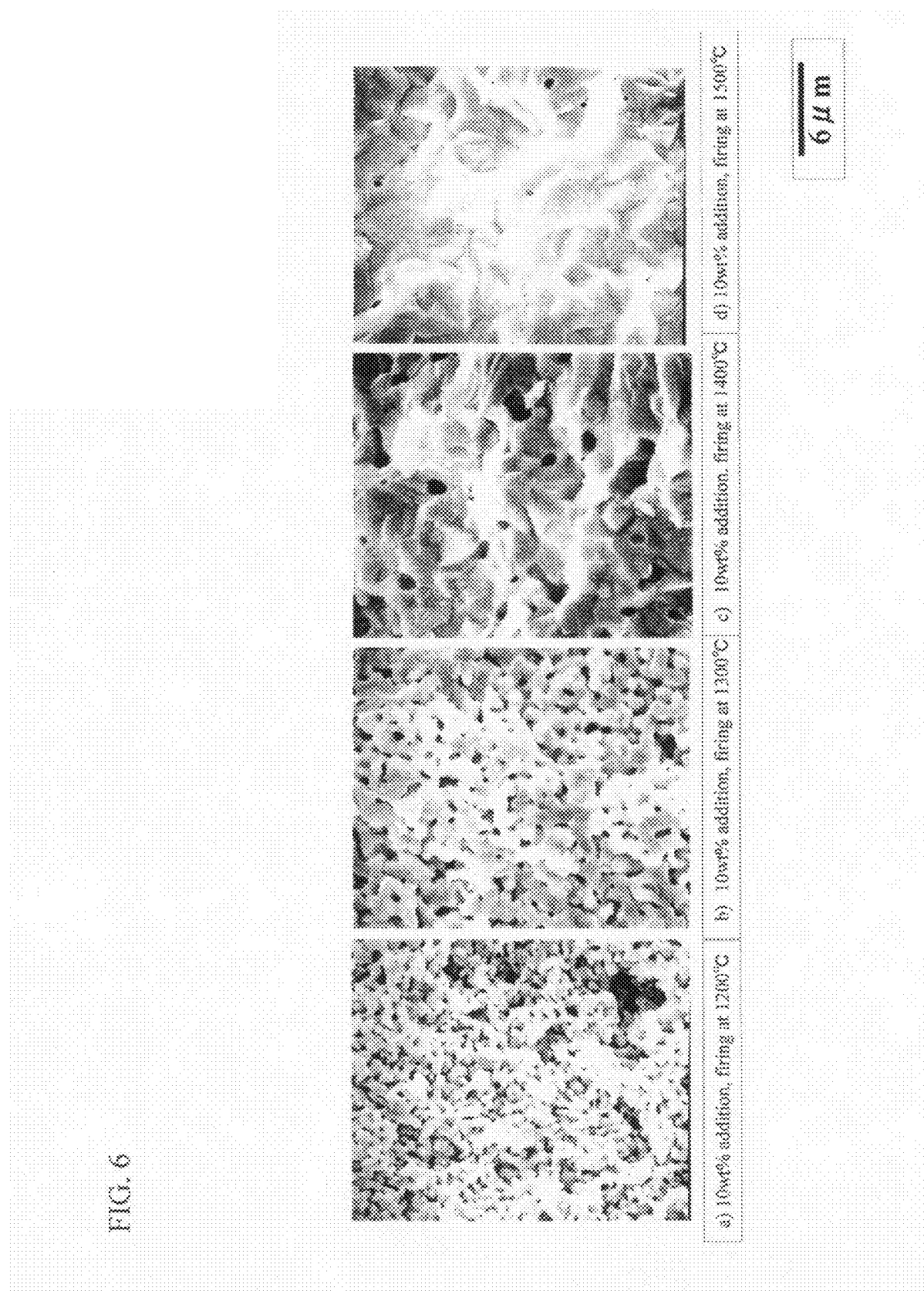
FIG. 6(a) is a SEM photograph in a case of 10 wt % addition and firing at 1200° C.
FIG. 6(b) is a SEM photograph in a case of 10 wt % addition and firing at 1300° C.
FIG. 6(c) is a SEM photograph in a case of 10 wt % addition and firing at 1400° C.
FIG. 6(d) is a SEM photograph in a case of 10 wt % addition and firing at 1500° C.

FIG. 6(a) is a SEM photograph in the case of 10 wt % addition and firing at 1200° C., FIG. 6(b) is a SEM photograph in the case of 10 wt % addition and firing at 1300° C., FIG. 6(c) is a SEM photograph in the case of 10 wt % addition and firing at 1400° C., and FIG. 6(d) is a SEM photograph in the case of 10 wt % addition and firing at 1500° C. The structure drastically changed at 1400° C. in this case.

Figure 7:
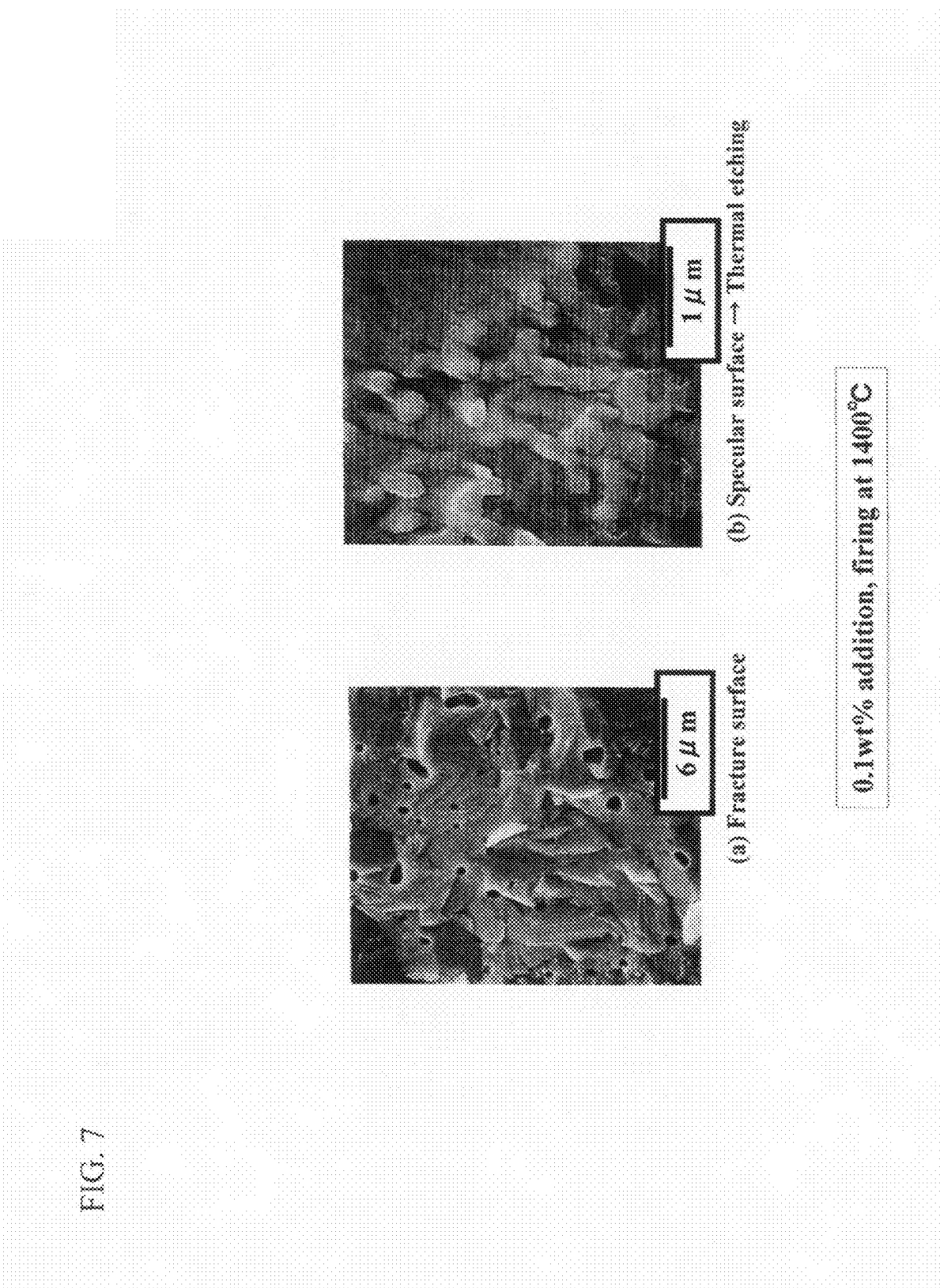
FIG. 7(a) is a SEM photograph of a fracture surface of a 0.1 wt % $B_2O_3$ addition system.
FIG. 7(b) is a SEM photograph of a specular surface in a state where thermal etching has been performed.
Figure 8:
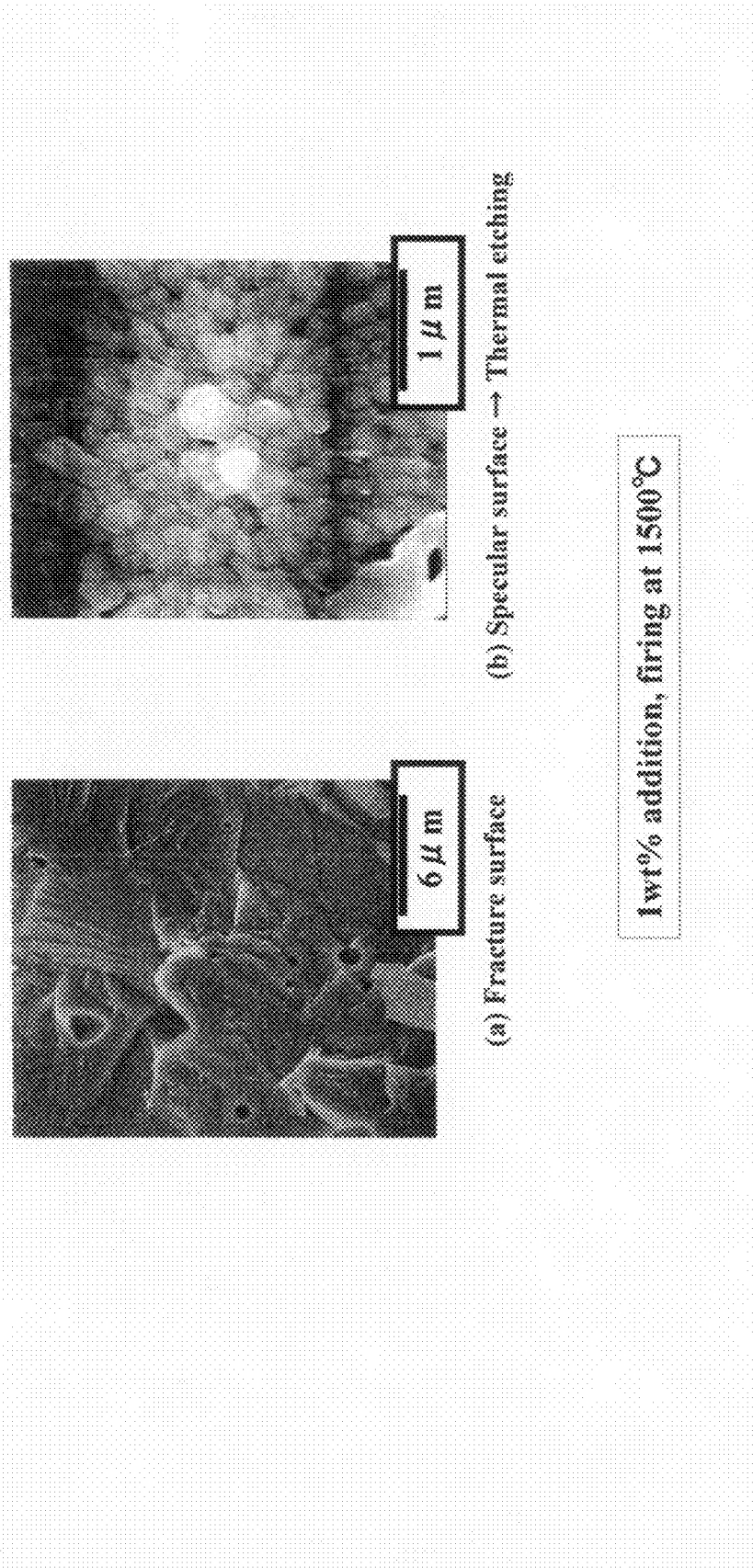
FIG. 8(a) is a SEM photograph of a fracture surface of a 1 wt % $B_2O_3$ addition system.
FIG. 8(b) is a SEM photograph of a specular surface in a state where thermal etching has been performed.
Figure 9:
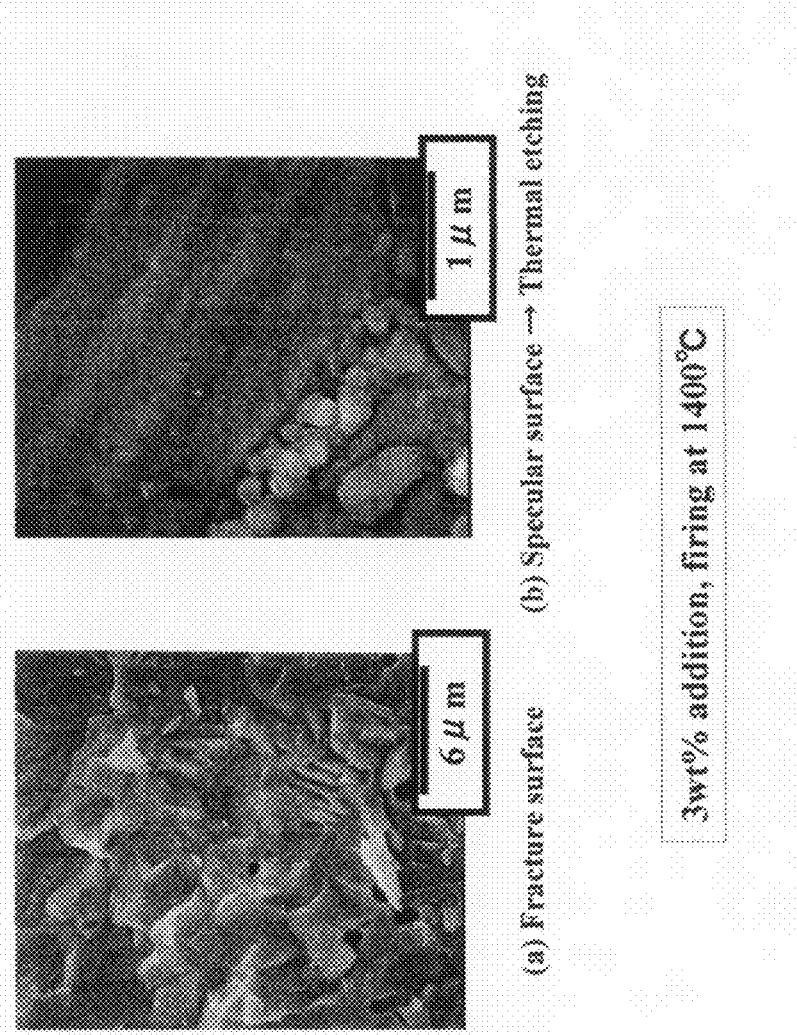
FIG. 9(a) is a SEM photograph of a fracture surface of a 3 wt % $B_2O_3$ addition system.
FIG. 9(b) is a SEM photograph of a specular surface in a state where thermal etching has been performed.

FIG. 7(a) is a SEM photograph of a fracture surface of the 0.1 wt % $B_2O_3$ addition system, FIG. 7(b) is a SEM photograph of a specular surface in a state where thermal etching has been performed, FIG. 8(a) is a SEM photograph of a fracture surface of the 1 wt % $B_2O_3$ addition system, FIG. 8(b) is a SEM photograph of a specular surface in a state where thermal etching has been performed, FIG. 9(a) is a SEM photograph of a fracture surface of the 3 wt % $B_2O_3$ addition system, and FIG. 9(b) is a SEM photograph of a specular surface in a state where thermal etching has been performed. These SEM photographs show that there is little $Y_2O_3$ grain growth because the firing temperature of the yttria sintered body is low.

If grain growth proceeds so as to make grains larger, the grains will be disjoined and the plasma-resistance will be deteriorated. However, according to the present invention, it is possible to control grain growth, so that a sintered body having a good plasma-resistance can be obtained.

Figure 10:
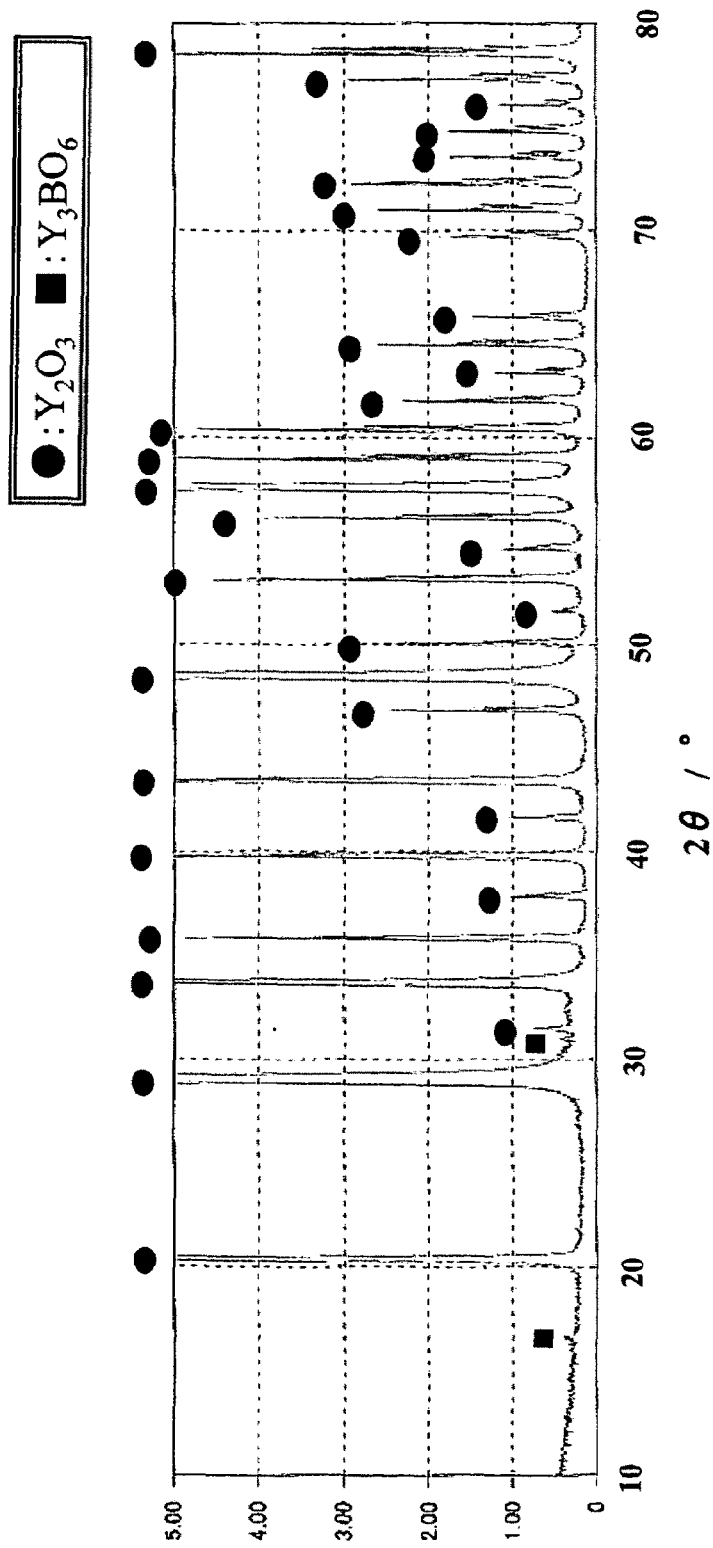
FIG. 10 is an X-ray diffraction profile of a 0.02 wt % $B_2O_3$ addition system.

FIG. 10 is an X-ray diffraction profile of the 0.02 wt % $B_2O_3$ addition system. This graph shows that slight $Y_3BO_6$ was slightly observed with a $Y_2O_3$ in the case of the 0.02 wt % $B_2O_3$ addition system.

Figure 11:
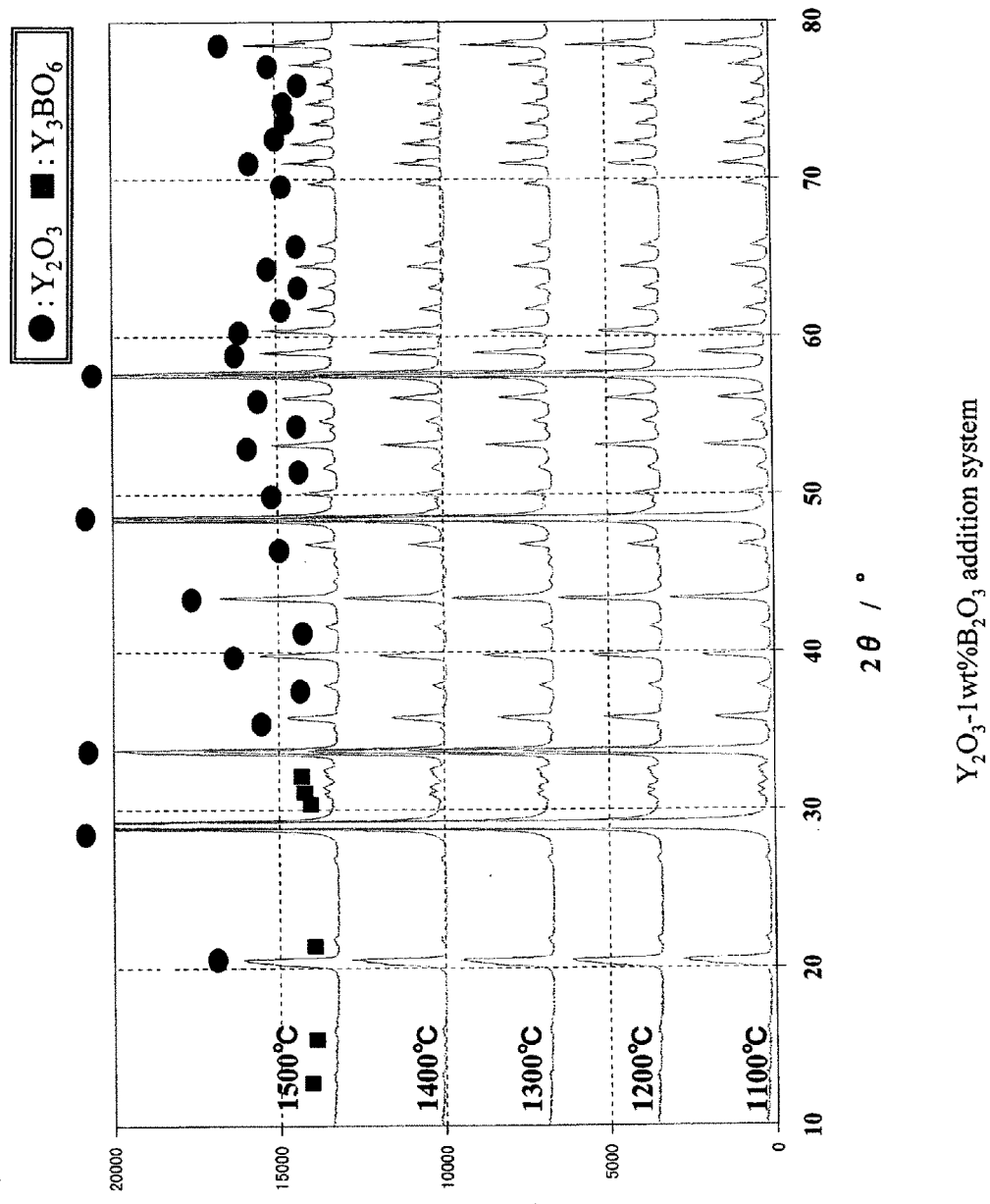
FIG. 11 is an X-ray diffraction profile of a 1 wt % $B_2O_3$ addition system.

FIG. 11 is an X-ray diffraction profile of the 1 wt % $B_2O_3$ addition system. This graph shows that an increased amount of $Y_3BO_6$ was observed in the case of the 1 wt % $B_2O_3$ addition system than in the case of the 0.02 wt % $B_2O_3$ addition system.

Figure 12:
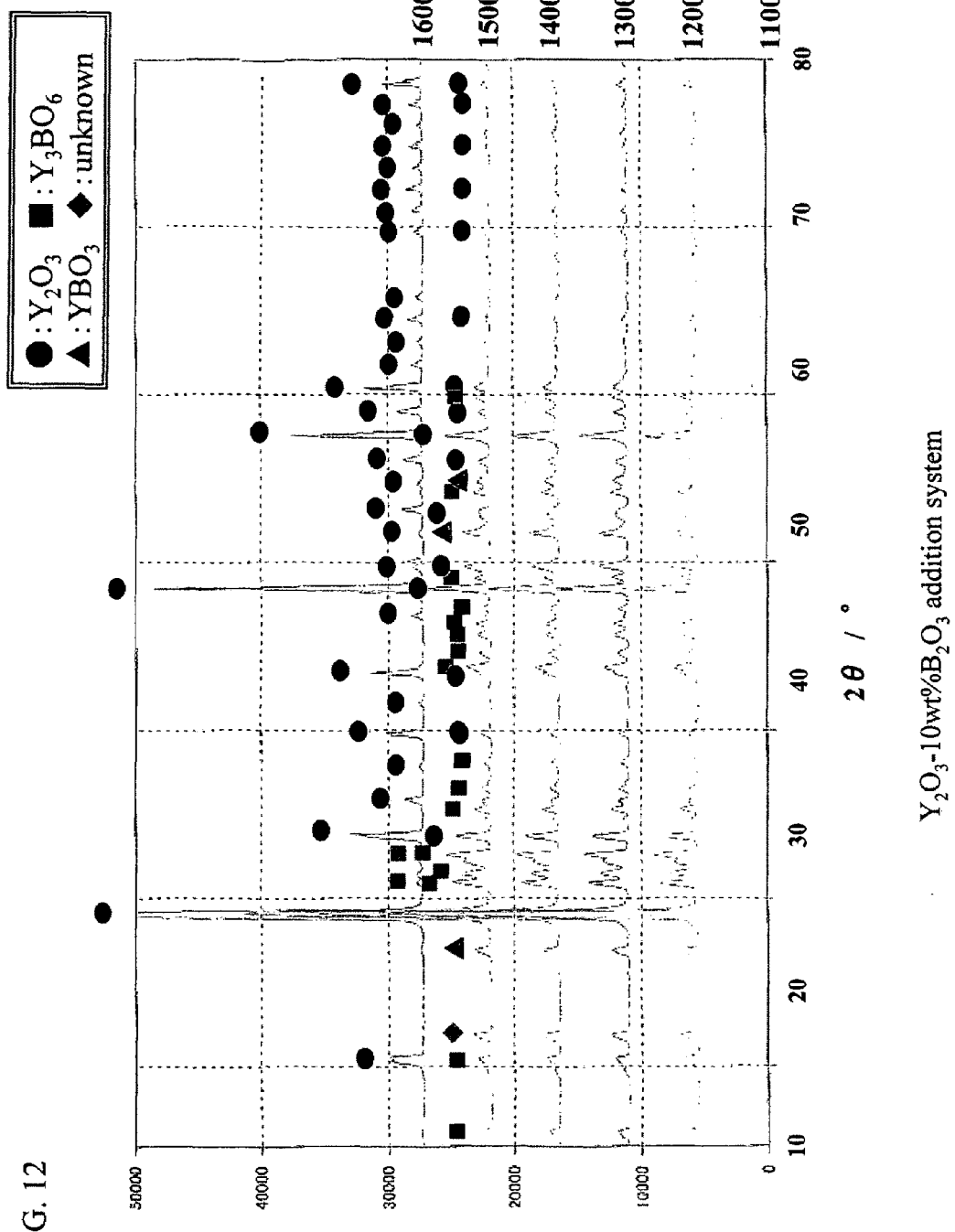
FIG. 12 is an X-ray diffraction profile of a 10 wt % $B_2O_3$ addition system.

FIG. 12 is an X-ray diffraction profile of the 10 wt % $B_2O_3$ addition system. This graph shows that slight $YBO_3$ was observed with a $Y_3BO_6$ in the case of the 10 wt % $B_2O_3$ addition system. It is assumed that when the additional amount of $B_2O_3$ exceeds 9.6 wt %, $YBO_3$ appears and the density becomes difficult to increase.

Next, the ratio of the $Y_3BO_6$ in the sintered body was calculated in the following manner:

An $Y_2O_3$ powder and a $B_2O_3$ powder were mixed such that a $B_2O_3$ was added at a larger ratio than a stoichiometric ratio for obtaining a $Y_3BO_6$ (9.3 wt %), pressed, and fired in a crucible under atmospheric pressure at 1400° C. for 10 hours. This was crushed, a $B_2O_3$ was added, pressed, fired in a crucible under atmospheric pressure at 1400° C. for 10 hour, and crushed again. It turned out that the obtained powder was a single phase of a $Y_3BO_6$ in which neither a $Y_2O_3$ nor a $B_2O_3$ existed by an XRD. The single phase of a $Y_3BO_6$ was confirmed based on the fact that it corresponded to JCPDS card 34-0291.

Reference samples were prepared by uniformly mixing the $Y_3BO_6$ powder obtained in the above-described manner (specific gravity: 4.638 g/cm$^3$) and an $Y_2O_3$ powder (specific gravity: 5.031 g/cm$^3$) at a volume ratio of 1, 5, 10, 20, 50 and 75 vol %, respectively. The mixed powder was measured by an XRD. The ratio of the value $I_{Y2O3}$ obtained by adding the diffraction peak intensity of (khl)=(211), (400) and (440) and the value $I_{Y3BO6}$ obtained by adding the diffraction peak intensity of (khl)=(003), (−601) and (−205) was calculated with respect to each XRD profile measured in the above-described manner. When $I_{Y3BO6}/(I_{Y2O3}+I_{Y3BO6})$ was set y-axis and the amount of $Y_3BO_6$ was set x-axis based on the calculated value, a linear relationship was obtained and this was used as a calibration curve.

Figure 13:
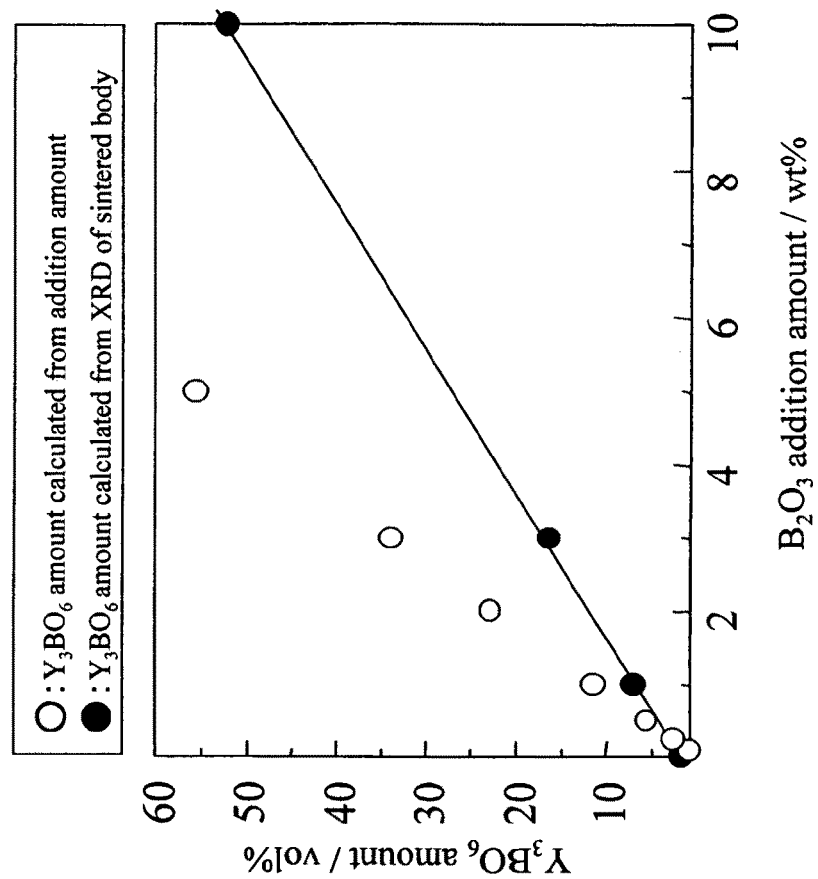
FIG. 13 is a graph showing the relationship between the amount of $Y_3BO_6$ in an yttria sintered body and the additional amount of boron oxide according to the present invention.

FIG. 13 shows the results of checking the relationship between the amount of a $Y_3BO_6$ in the yttria sintered body and the additional amount of a $B_2O_3$ according to the present invention. When the $B_2O_3$ of 0.02-10 wt % was added, the amount of a $Y_3BO_6$ in the yttria sintered body was around 0.12-60 vol % although it depended on the atmosphere during the firing. It turned out that almost half boron evaporated during the firing.

With this, it is possible to densify an yttria sintered body at low temperature when the amount of a $Y_3BO_6$ in the yttria sintered body exceeds 0.12 vol % after sintering. Further, it is possible to obtain a stable sintered body having high density because a $YBO_3$ is hard to form and firing at low temperature is possible when the amount of a $Y_3BO_6$ in the yttria sintered body is less than 60 vol % after sintering.

As the boron compound, a boric acid ($H_3BO_3$), a boron nitride (BN) or a boron carbide ($B_4C$) may be used as well as a boron oxide ($B_2O_3$). Among these, the boron oxide and the boric acid are preferred.

Figure 14:
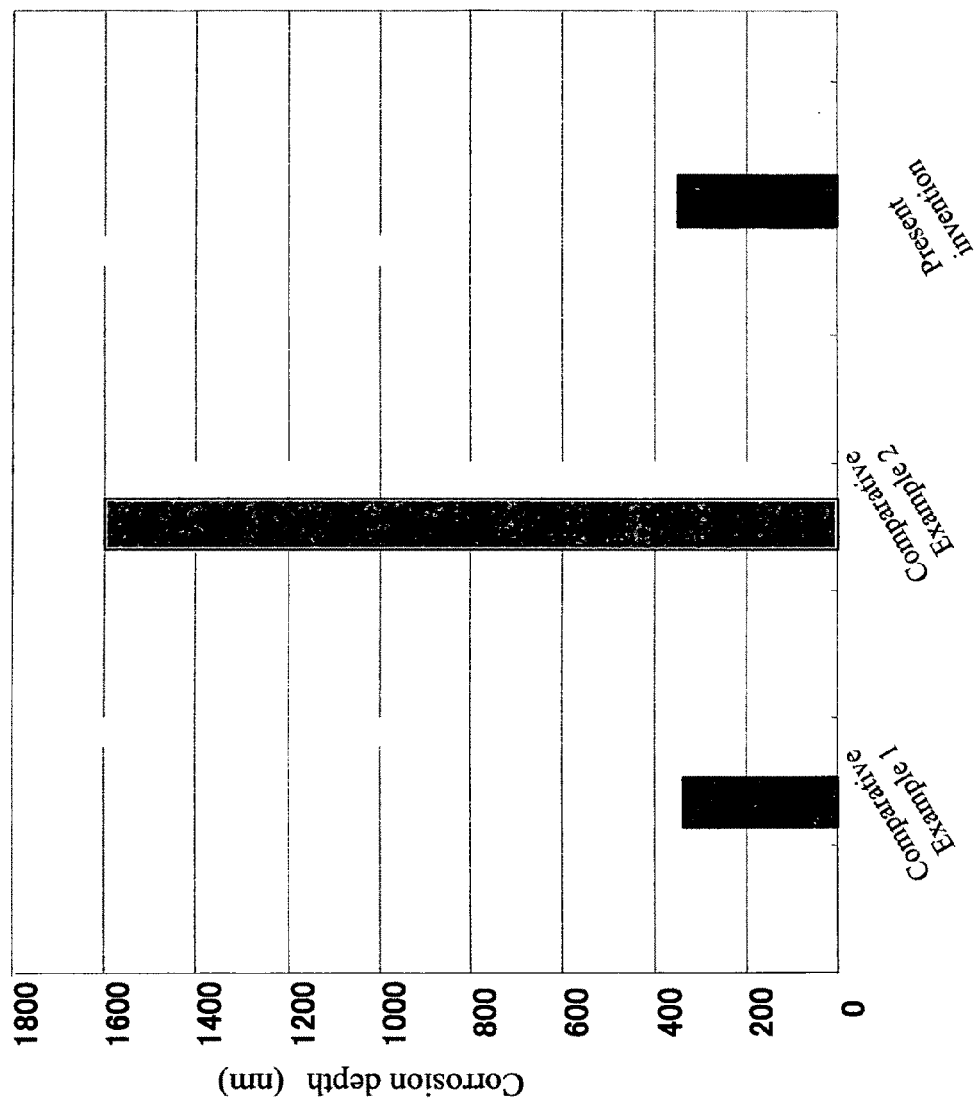
FIG. 14 is a graph comparing plasma-resistance between the present invention and a conventional art.

FIG. 14 is a graph comparing the plasma-resistance between the present invention and a conventional art, and Table 1 also compares the plasma-resistance between the present invention and a conventional art.

TABLE 1

|  | Comparative Example 1 | Comparative Example 2 | Present invention |
|---|---|---|---|
| Material | $Y_2O_3$ | Sapphire | $Y_2O_3$-$Y_3BO_6$ |
| Corrosion Depth (nm) | 300-400 | 1600 | 300-400 |
| Average Corrosion Depth (nm) | 350 | 1600 | 350 |
| Ra before plasma radiation (nm) | 7.2 |  | 4 |
| Ra after plasma radiation (nm) | 15.4 |  | 9.8 |

FIG. 14 and Table 1 show that the yttria sintered body according to the present invention is excellent in plasma-resistance.

The yttria ($Y_2O_3$) sintered body according to the present invention can be used as a corrosion-resistant material which requires plasma-resistance such as a chamber, a capture ring, a focus ring, an electrostatic chuck of a plasma processing apparatus.

According to the present invention, it is possible to obtain an yttria ($Y_2O_3$) sintered body having high density and excellent plasma-resistance easily at relatively low temperature.

Although there have been described what are the present exemplary embodiments of the invention, it will be understood that variations and modifications may be made thereto within the scope of the present invention, as reflected in the appended claims.

What is claimed is:

1. A method for manufacturing an yttria sintered body comprising the steps of:

adding a boron oxide ($B_2O_3$) of 0.02 wt % to 10 wt % to yttria ($Y_2O_3$) powder;

forming the mixed powder; and sintering the formed mixed powder at 1300-1600° C. such that the boron in the yttria sintered body is present as a $Y_3BO_6$.

2. A method for manufacturing an yttria sintered body comprising the steps of:

adding boron oxide ($B_2O_3$) of 0.02 wt % to 10 wt % to yttria ($Y_2O_3$) powder;

forming the mixed powder; and sintering the formed mixed powder at 1400-1500° C. such that the boron in the yttria sintered body is present as a $Y_3BO_6$.

3. The method according to claim 1, wherein the sintering of the formed mixed powder is performed at 1583° C. or less.

* * * * *

UNITED STATES PATENT AND TRADEMARK OFFICE
CERTIFICATE OF CORRECTION

| | |
|---|---|
| PATENT NO. | : 7,566,675 B2 |
| APPLICATION NO. | : 12/214994 |
| DATED | : July 28, 2009 |
| INVENTOR(S) | : Ide et al. |

It is certified that error appears in the above-identified patent and that said Letters Patent is hereby corrected as shown below:

<u>Column 1</u>:

Line 4, change "CROSS REFERENCES" to --CROSS-REFERENCES--.

<u>Column 2</u>:

Line 34, change "having a excellent" to --having an excellent--.
Line 47, change "a corrosion-resistance material" to --a corrosion-resistant material--.
Line 62, change "alone, however, a" to --alone; however, a--.

<u>Column 3</u>:

Line 5, change "above-described an yttria sintered" to --above-described yttria sintered--.
Line 36, change "3 wt % additions" to --3wt % addition--.

<u>Column 4</u>:

Line 10, change "8 kinds" to --Eight kinds--.
Line 23, change "density correspond" to --density data correspond--.
Line 43, change "because slightly included a $YBO_3$ dis-" to --because it slightly included a $YBO_3$, which dis- --.
Line 60, change "occurred at 1500°C." to --occur at 1500°C.--.

UNITED STATES PATENT AND TRADEMARK OFFICE
CERTIFICATE OF CORRECTION

PATENT NO. : 7,566,675 B2
APPLICATION NO. : 12/214994
DATED : July 28, 2009
INVENTOR(S) : Ide et al.

It is certified that error appears in the above-identified patent and that said Letters Patent is hereby corrected as shown below:

<u>Column 5</u>:

Line 53, change "An $Y_2O_3$ powder" to --A $Y_2O_3$ powder--.
Line 58, change "for 10 hour" to --for 10 hours--.

Signed and Sealed this

Twenty-second Day of December, 2009

David J. Kappos
*Director of the United States Patent and Trademark Office*